(12) United States Patent
Elläet al.

(10) Patent No.: US 6,496,085 B2
(45) Date of Patent: Dec. 17, 2002

(54) SOLIDLY MOUNTED MULTI-RESONATOR BULK ACOUSTIC WAVE FILTER WITH A PATTERNED ACOUSTIC MIRROR

(75) Inventors: Juha Ellä, Halikko; Jyrki Kaitila, Helsinki; Meeri Talvikki Partanen, Espoo, all of (FI)

(73) Assignee: Nokia Mobile Phones LTD, Espoo (FI)

( * ) Notice: Subject to any disclaimer, the term of this patent is extended or adjusted under 35 U.S.C. 154(b) by 0 days.

(21) Appl. No.: 09/753,214

(22) Filed: Jan. 2, 2001

(65) Prior Publication Data

US 2002/0084873 A1 Jul. 4, 2002

(51) Int. Cl.[7] .............................. H03H 9/56; H03H 3/02; H03H 9/05
(52) U.S. Cl. ...................... 333/189; 333/191; 29/25.35; 310/335; 310/348
(58) Field of Search ................................ 333/186–192; 310/321, 334, 335, 348; 29/25.35

(56) References Cited

U.S. PATENT DOCUMENTS

| | | | |
|---|---|---|---|
| 5,714,917 A | 2/1998 | Ella | 333/133 |
| 5,821,833 A | * 10/1998 | Lakin | 333/187 |
| 5,864,261 A | * 1/1999 | Weber | 333/187 |
| 5,872,493 A | * 2/1999 | Ella | 333/191 |
| 5,873,154 A | 2/1999 | Ylilammi et al. | 29/25.35 |
| 5,910,756 A | 6/1999 | Ella | 332/144 |
| 6,060,818 A | 5/2000 | Ruby et al. | 310/363 |

FOREIGN PATENT DOCUMENTS

| | | |
|---|---|---|
| EP | 0 963 000 A2 | * 12/1999 |
| EP | 1 017 170 A2 | * 7/2000 |

OTHER PUBLICATIONS

Lakin et al., "Development of Miniature Filters for Wireless Applications", IEEE Transactions on Microwave Theory and Techniques, vol. 43, No. 12, Dec. 1995.

IEEE MTT–S 1997; vol. 1 pp 181–184; Thin FilmZnO Based Bulk Acoustic Mode Filters, C.W. Seabury, et al, Jun. 8–13, 1997.

"Face–Mounted Piezoelectric Resonators," by W.E. Newell, from *Proceedings of the IEEE*, Jun. 1965, pp. 575–581.

(List continued on next page.)

*Primary Examiner*—Robert Pascal
*Assistant Examiner*—Barbara Summons
(74) *Attorney, Agent, or Firm*—Ware, Fressola, Van Der Sluys & Adolphson LLP

(57) ABSTRACT

A method of fabricating a multi-resonator bulk acoustic wave (BAW) filter and a filter provided by such a method, the filter having a plurality of layers of materials serving as an acoustic mirror for a plurality of resonator sections, each resonator section including at least a top electrode and a bottom electrode sandwiching a piezolayer, the method including the steps of: choosing dielectric materials for some of the layers of materials serving as the acoustic mirror and metallic materials for the others of the layers; and providing at least one of the metallic layers via a fabrication procedure in which the metallic layer is patterned into distinct portions by an etching process that removes enough of the metallic layer between where different resonator sections are to be placed as to provide electrical isolation between the portions of the layer beneath the different resonator sections; thereby providing a multi-resonator BAW filter with reduced capacitive coupling between resonators, compared to the capacitive coupling present in a multi-resonator BAW filter fashioned in a similar manner except excluding the step of etching to pattern any metallic layers of the similarly fashioned acoustic mirror.

10 Claims, 6 Drawing Sheets

OTHER PUBLICATIONS

"Acoustic Bulk Wave Composite Resonators," by K.M. Lakin and J.S. Wang, from *Applied Physics Letter*, Feb. 1, 1981, vol. 38, No. 3, pp. 125–127.

"FBAR Technology Shrinks CDMA Handset Duplexers," by D. McNamara, from *Microwaves & RF*, Sep. 2000, pp. 71–79.

* cited by examiner

1. Deposition of all mirror layers

2. Etching of mirror layers

3. Deposition of the thick planarazation layer

4. Wafer after polishing

5. Deposition of resonator section

1. Deposition of the mirror layers up to but not including the topmost (dielectric) layer 2. Etching of deposited mirror layers 3. Deposition of the thick planarazation layer 4. Wafer after polishing 5. Deposition of the last dielectric layer 6. Deposition of the resonator section

SOLIDLY MOUNTED MULTI-RESONATOR BULK ACOUSTIC WAVE FILTER WITH A PATTERNED ACOUSTIC MIRROR

FIELD OF THE INVENTION

The present invention relates to bulk acoustic wave resonators. More particularly, the present invention relates to multi-resonator bulk acoustic wave filters with acoustic mirrors.

BACKGROUND OF THE INVENTION

A thin film bulk acoustic wave (BAW) resonator is based on a layer of piezoelectric material, such as ZnO or AlN, and in some cases includes an acoustic mirror. Such a device converts sound waves to electric signals, and vice versa, and can be used as a filter in electronic circuits because of its frequency dependent electrical impedance. Typically, the acoustic mirror is formed from a combination of layers of materials of differing acoustic impedance. The acoustic mirror is built up on a substrate of for example glass by depositing its various layers of different materials so as to form a stack of layers of different materials on the substrate. Next, a bottom electrode is deposited on the acoustic mirror, and the piezoelectric material is then deposited on the bottom electrode forming a so called piezolayer. Finally, a top electrode is deposited on the piezolayer. The combination of top and bottom electrodes and the piezolayer forms what is called the resonator section of the device. The acoustic mirror serves to reflect acoustic waves created by the piezolayer in response to a voltage applied across the electrodes, thereby isolating the substrate from the piezolayer.

An example of a resonator including an acoustic mirror is disclosed in the article entitled "Development of Miniature Filters for Wireless Applications", IEEE Transactions on Microwave Theory and Techniques, Vol. 43, No. 12, December 1995. The acoustic mirror in such a resonator may include a lower layer having a low acoustic impedance and a thickness of approximately one-quarter wavelength, and an upper layer having a high acoustic impedance. In such a device, a layer pair serves as an "impedance transformer," since it can transform the acoustic impedance of a substrate to a very low value. In a device where each of the layers has a thickness of approximately one-quarter wavelength, the conversion factor of the pair of layers is equal to the square of the ratio of their respective impedances.

Besides BAW resonators including acoustic mirrors, it is known in the art to provide BAW resonators constructed on a membrane, with an airgap separating the resonator section from the substrate. The disadvantages of the membrane type approach are that it is difficult to produce the layers on top of the membrane so that they have sufficiently small mechanical stress, which would break or bend the membrane. In addition, the membrane structure is not very rugged mechanically, which complicates the handling and dicing of ready wafers (glass or silicon wafers, 4' to 8' in diameter, that are fully processed, containing thousands of resonator-based filters). Depending on the type of membrane, there may be limitations on the possible substrate material that can be used.

The acoustic mirror type of BAW resonator is clearly more rugged, since the entire structure is solidly mounted on the substrate. The mirror operates basically as a $\lambda/4$ transformer, i.e. it consists of multiple pairs of alternating layers of high and low acoustic impedance materials, each approximately acoustically one quarter wavelength thick. Thus, the entire stack transforms the acoustic impedance of the substrate to a very low impedance at the mirror/bottom electrode interface, creating an acoustically reflective interface similar to the air interface in membrane type structures. The optimal operation of the mirror requires that the difference in the high and low impedance be as large as possible. The difference in the acoustic impedance of currently available dielectric films is not large so that a large number of layers must be used for an all-dielectric acoustic mirror. Using a large number of layers reduces the bandwidth of the mirror and complicates its fabrication.

By using metal and dielectric layers to make an acoustic mirror, the impedance difference can be increased considerably, but so doing introduces a large capacitance provided by the bottom electrode and the top metal layer of the mirror. As illustrated in FIG. 1, such capacitance degrades the performance of filters consisting of two or more resonators on a single substrate; the top metallic layer of the mirror creates a capacitance from each bottom electrode to all the other bottom electrodes in a filter, providing a parasitic capacitive coupling between the resonators.

What is needed is an acoustic-mirror type of resonator in which the acoustic mirror consists of alternating metallic and dielectric layers so as to provide good reflectivity with a relatively small number of layers, but does not introduce capacitive coupling to other resonators formed on the same substrate and using the same acoustic mirror.

SUMMARY OF THE INVENTION

Accordingly, the present invention provides a method of fabricating a multi-resonator bulk acoustic wave (BAW) filter and also a filter provided by such a method, the filter having a plurality of layers of materials serving as an acoustic mirror for a plurality of resonator sections, each resonator section including at least a top electrode and a bottom electrode sandwiching a piezolayer, the method including the steps of: choosing dielectric materials for some of the layers of materials serving as the acoustic mirror and metallic materials for the others of the layers; and providing at least one of the metallic layers via a fabrication procedure in which the metallic layer is patterned into distinct portions by an etching process that removes enough of the metallic layer between where different resonator sections are to be placed as to provide electrical isolation between the portions of the layer beneath the different resonator sections; thereby providing a multi-resonator BAW filter with reduced capacitive coupling between resonators, compared to the capacitive coupling present in a multi-resonator BAW filter fashioned in a similar manner except excluding the step of etching to pattern any metallic layers of the similarly fashioned acoustic mirror.

In a further aspect of the invention, all of the metallic layers are patterned into distinct portions so as to provide electrical isolation between the portions of the all of the layers beneath the different resonator sections.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

Figure 1:
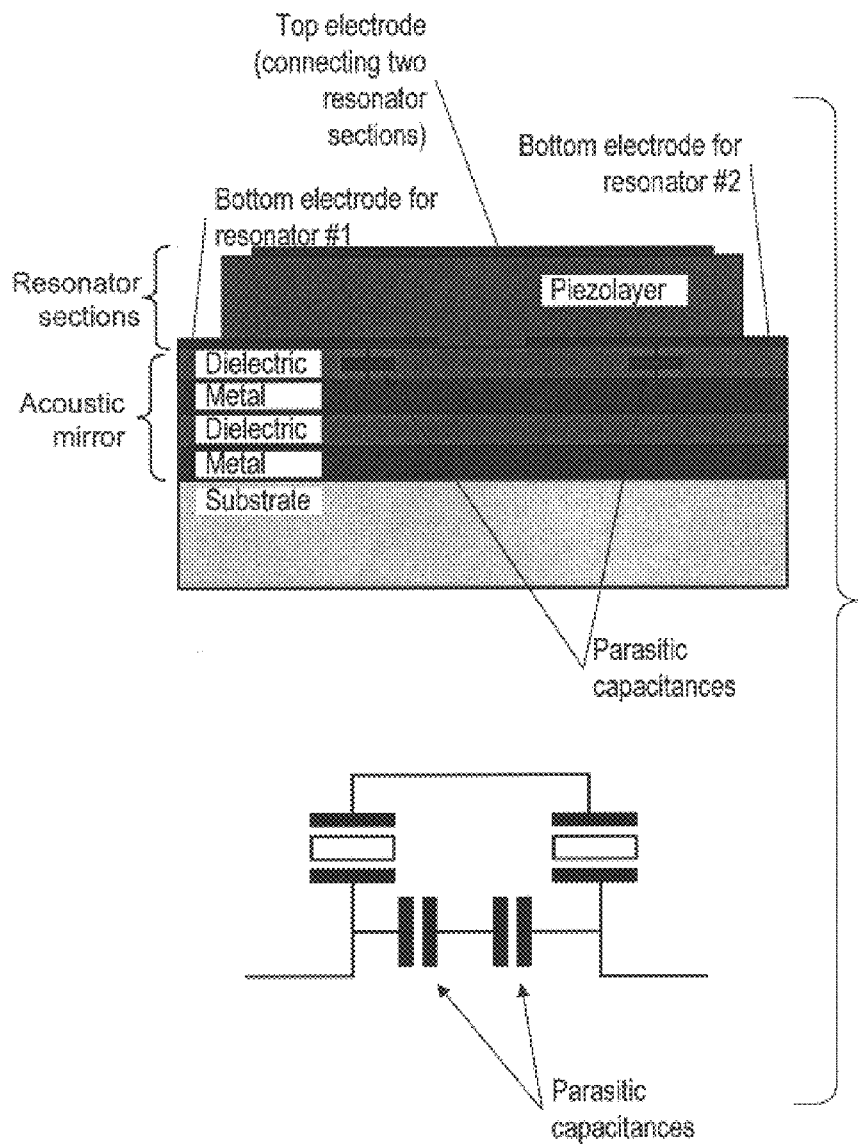
FIG. 1 is a schematic of a multi-resonator filter, consisting of several acoustic mirror type BAW resonators, according to the prior art, illustrating capacitive coupling when metallic layers are used in the acoustic mirror.
Figure 2:
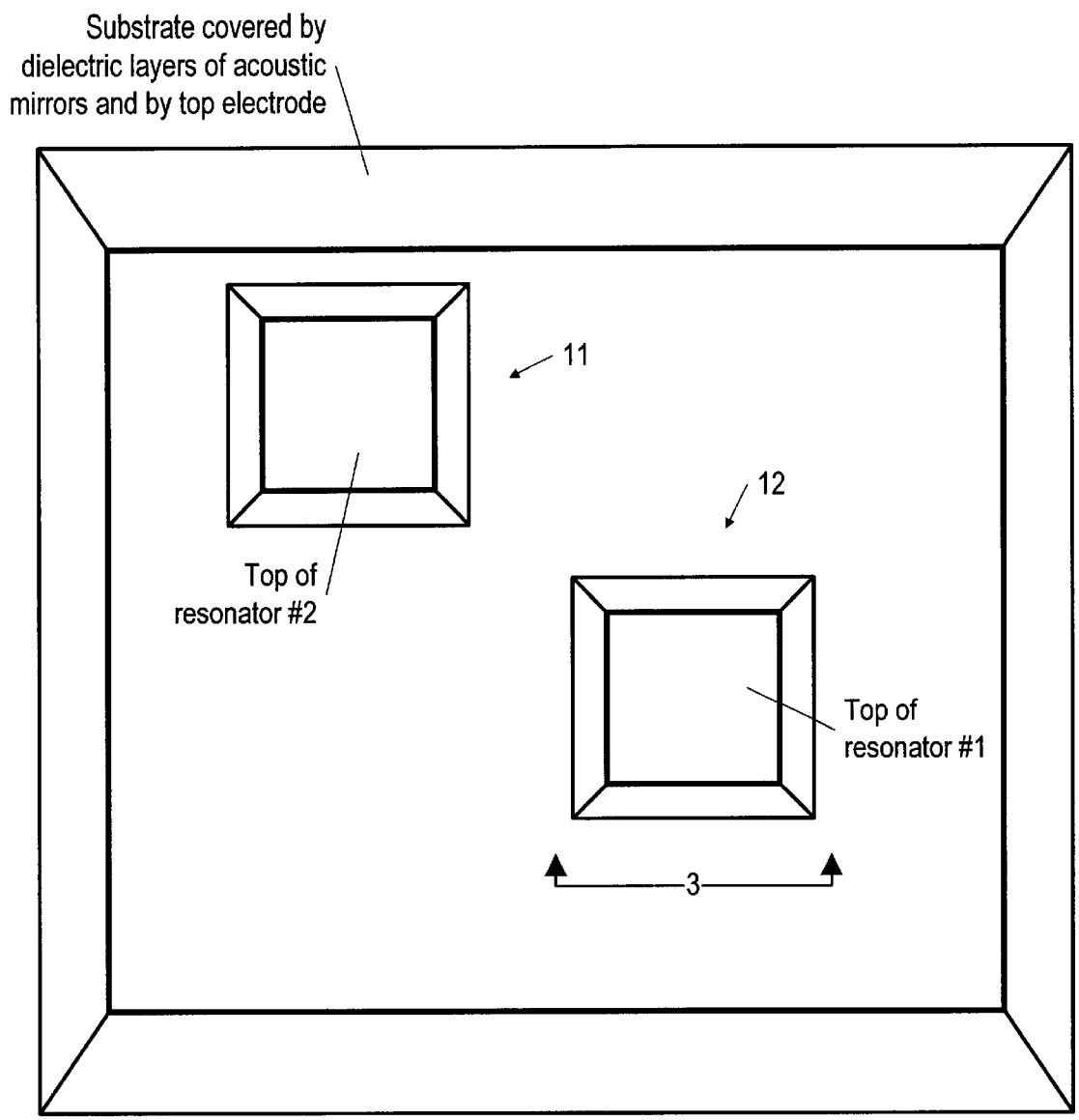
FIG. 2 is a plan view of a multi-resonator filter, consisting of several acoustic mirror type BAW resonators, according to the present invention.
Figure 3:
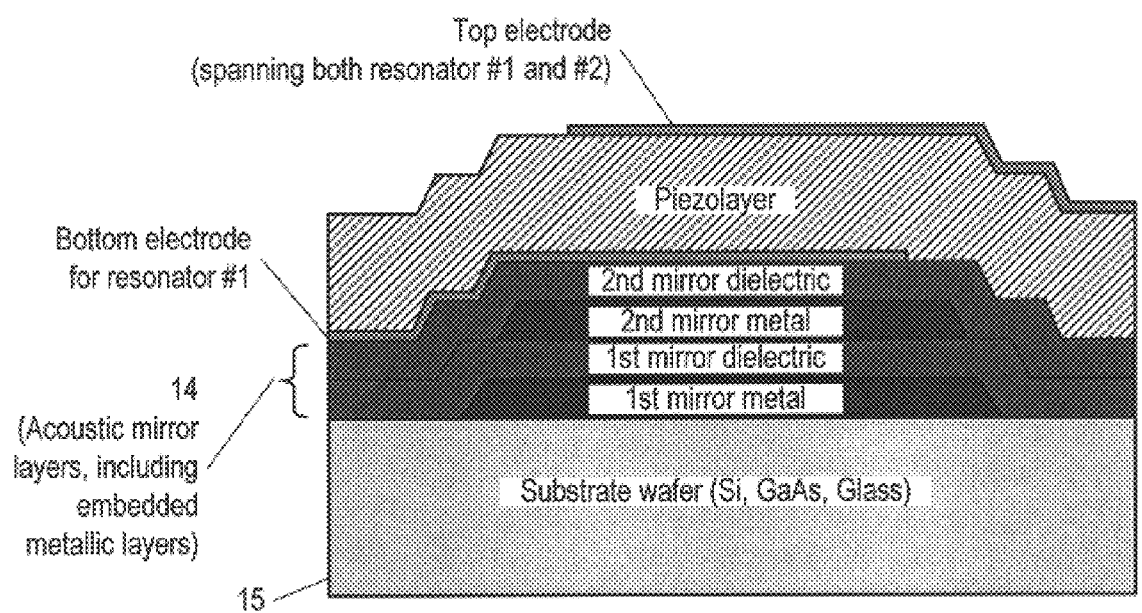
FIG. 3 is an elevation view of one of the resonators illustrated in FIG. 2.

Referring now to FIGS. 2 and 3, according to the present invention, an acoustic-mirror type multi-resonator BAW filter consists of resonator sections 11 12 situated on top of acoustic mirror layers 14, including metallic layers and dielectric layers, deposited on a substrate 15 so that no metallic mirror layer extends to beneath more than one resonator section. As is explained below, to fabricate such an acoustic-mirror type multi-resonator BAW filter, at least the metallic layers of the acoustic mirror are removed from between the resonator sections. Such selective removal of a deposited material is here called patterning the deposited material.

Figure 4:
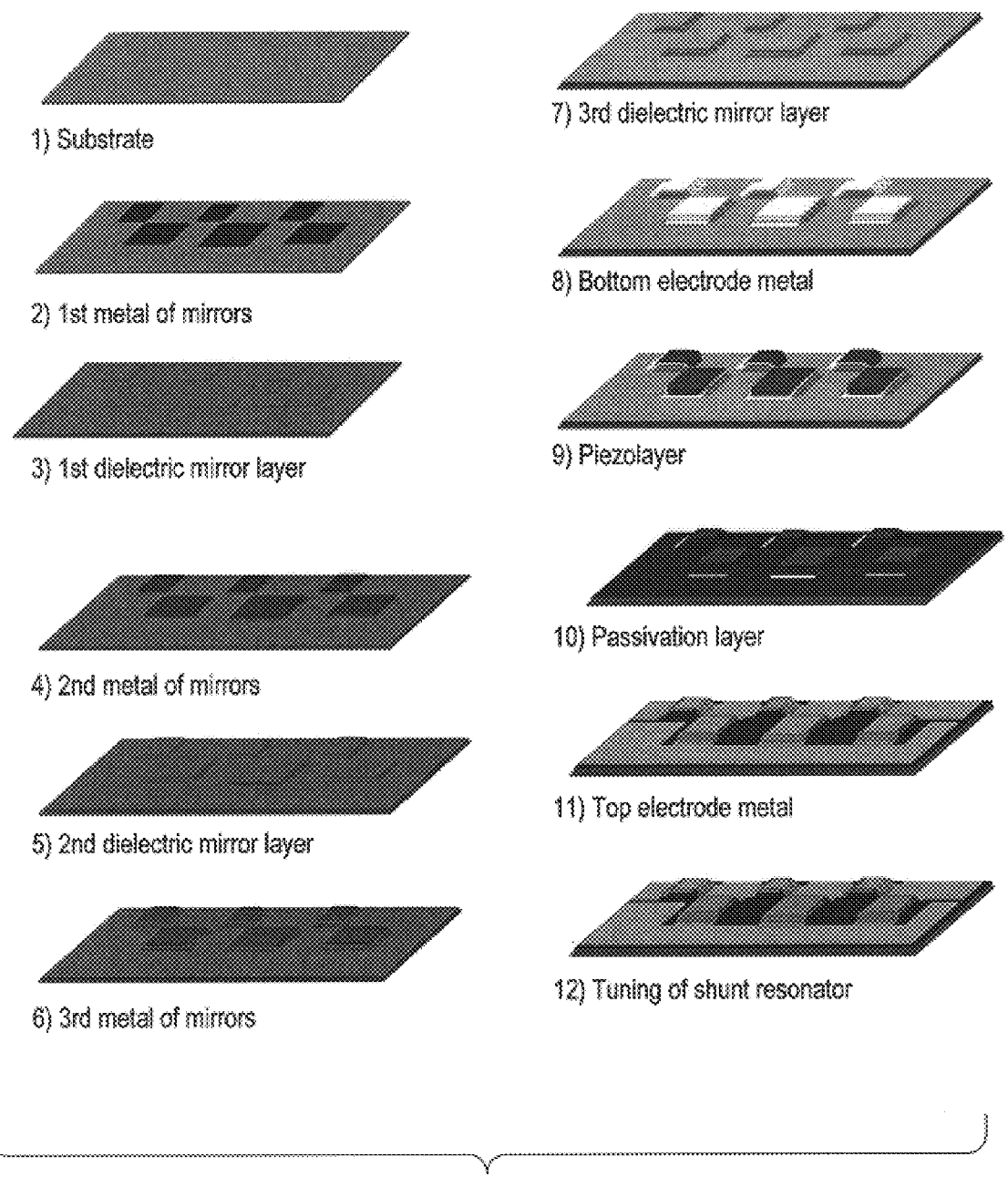
FIG. 4 is an illustration of one process for fabricating a multi-resonator filter, consisting of several acoustic mirror type BAW resonators, according to the present invention, a process in which, from among the layers of the acoustic mirror material, only the metallic layers are patterned (i.e. removed from some selected areas of the face of the filter), not the dielectric layers (although other layers making up the filter are also patterned, including the bottom and top electrode)

There are basically two ways of fabricating a multi-resonator BAW filter including an acoustic mirror, having metallic layers and dielectric layers, in which at least the metallic layers are patterned. Referring now to FIG. 4, one method is to deposit in turn the successive layers making up the acoustic mirror, and in so doing, after depositing each metallic layer, to selectively remove it from between each region where a resonator section will be built up before depositing the next dielectric layer. The deposition of the metals is usually done by sputtering. The dielectric layers can be grown for example by Chemical Vapor Deposition (CVD) or Plasma Enhanced CVD. The selective removal (called here patterning) of the metallic layers can be done by either wet or dry etching. With either etching method, it is possible to obtain sloped edges of the metallic layers, which is helpful in avoiding step coverage problems. The resulting layer stack for one resonator is shown schematically in FIG. 3. For the dielectric (low acoustic impedance) layers, the preferred materials are SiO2 or Si3N4, and the preferred materials for the metallic (high impedance) layers are W or Mo, although other materials can also be used. When the piezolayer is deposited, it extends across the entire face of the substrate (on top of the layers already deposited). The piezolayer can either be left unpatterned (not selectively removed), for example when fabricating a two-stage balanced filter (except for providing for vias, i.e. holes in a dielectric layer created by patterning the layer so that when a metal is then deposited on the dielectric layer it will fill the hole, thus providing a connection through the dielectric layer), or the piezolayer can be removed everywhere except on top of each mirror stack.

Figure 5:
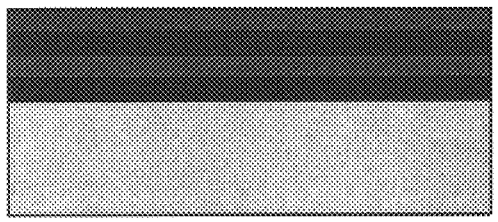
FIG. 5 is an illustration of an alternative process for fabricating a multi-resonator filter, consisting of several acoustic mirror type BAW resonators, according to the present invention, a process that achieves the same end result of eliminating the source of parasitic capacitances, but patterns both the metallic layers that will serve as components of the acoustic mirror beneath each resonator section, as well as the dielectric layers.
Figure 5:
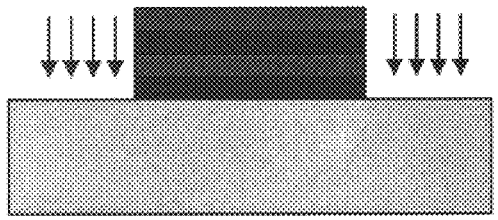
Figure 5:
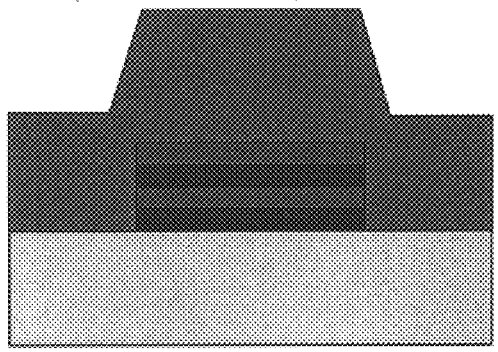
Figure 5:
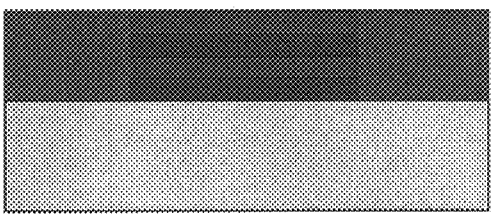
Figure 5:
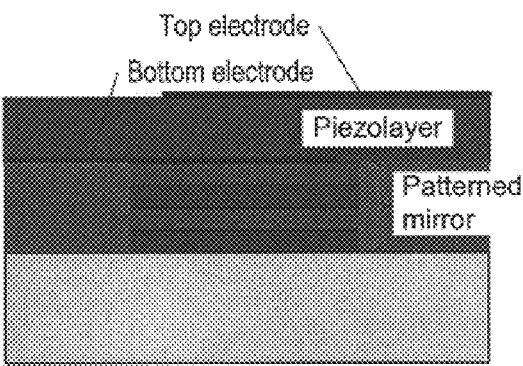

Referring now to FIG. 5, the second method of fabricating a multi-resonator BAW filter with an acoustic mirror having patterned metallic layers is to first deposit all the mirror layers and then etch through all the layers to the substrate surface, thereby patterning (selectively removing) not only the metallic layers between each resonator section, but also the dielectric layers. The substrate between resonators is then left bare, and there is a large step from the substrate surface to the top of the mirror. Because of the large step, the entire structure of individual acoustic mirrors sitting on top of a bare substrate should be planarized, i.e. a thick layer of some dielectric material such as SiO2 or Si3N4 should be deposited over the structure and then polished by for example Chemical Mechanical Polishing (CMP) down to the top of the mirror stacks. After planarizing the structure, the electrodes and the piezolayer are deposited on the polished structure, according to the location of each embedded acoustic mirror.

Figure 6:
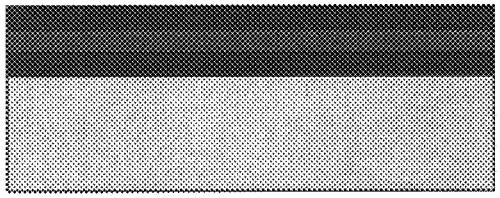
FIG. 6 is an illustration of a process that is a slight variation of the process depicted in FIG. 5.
Figure 6:
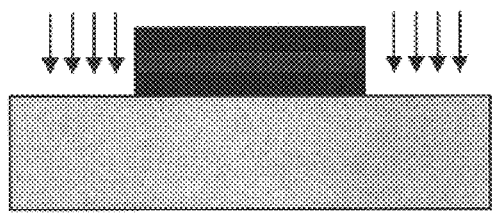
Figure 6:
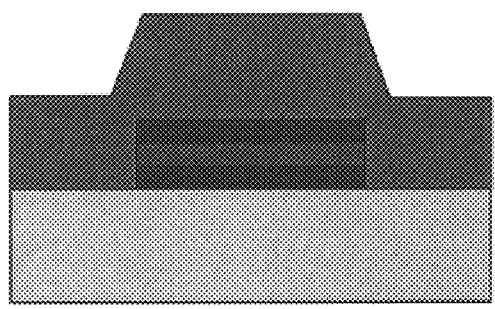
Figure 6:
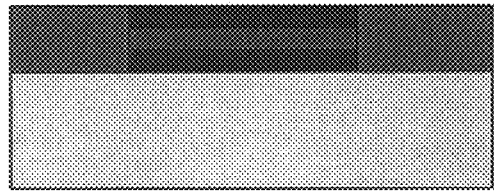
Figure 6:
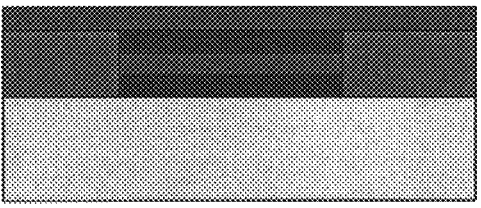
Figure 6:
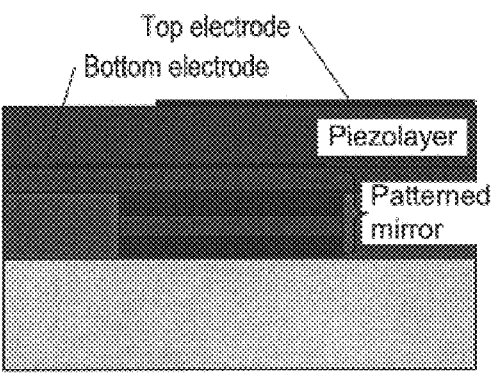

Various modifications to the two above methods will be apparent to those skilled in the art. For example, referring now to FIG. 6, the second method can be modified by etching and planarizing the mirror stack before depositing the last dielectric mirror layer. Such a modification makes it easier to determine when to stop polishing (which in such a modified procedure would be when the surface of the topmost metallic mirror layer is reached). One could also deposit an additional, sacrificial layer to avoid dishing of the mirror layers, i.e. to avoid having the mirror layers warp into the shape of a dish, which often occurs in a CMP process.

As should be clear from the above description, the present invention also comprehends a multi-resonator BAW filter fabricated in such a way as to include a completely separate and distinct acoustic mirror beneath each resonator section (advantageously planarized as described above), as opposed to the construction indicated in FIG. 4, in which each dielectric layer in the acoustic mirror material beneath one resonator section is deposited over the entire face of the substrate so as to extend beneath every other resonator section.

No matter how many layers of an acoustic mirror are patterned, it is important to understand that only enough of a layer need be patterned into portions, i.e. removed from between where resonator sections are to be placed so as to provide distinct portions of the layer, as to provide electrical isolation between the portions of the layer beneath the different resonator sections.

The inventors have discovered that by fabricating a multi-resonator BAW filter according to the invention, there is an improvement (reduced response) in the frequency response of the filter not only away from the center frequency, but there is also an improvement in the response at or near the center frequency. Where a filter according to the prior art will sometimes exhibit a response at or near the center frequency that is highly irregular (i.e. having a deep notch) as a result of the above-described parasitic capacitances, the response of a filter according to the invention is that of a relatively well-behaved band-pass filter, with a response away from the center frequency that is as much as 6 dB below that of a filter according to the prior art. Although notching near the center frequency of an acoustic mirror type multi-resonator filter can be avoided by taking steps that do not include patterning the metallic layers of the acoustic mirror as in the invention, such steps often result in a reduced bandwidth for the filter. No such bandwidth reduction occurs in the case of fabricating a filter according to the present invention.

It is to be understood that the above-described arrangements are only illustrative of the application of the principles of the present invention. Numerous modifications and alternative arrangements may be devised by those skilled in the art without departing from the spirit and scope of the present invention, and the appended claims are intended to cover such modifications and arrangements.

What is claimed is:

1. A method of fabricating a multi-resonator bulk acoustic wave (BAW) filter having a plurality of layers of materials serving as an acoustic mirror for a plurality of resonator sections, each resonator section including at least a top electrode and a bottom electrode sandwiching a piezolayer, the method comprising the steps of:

a) choosing dielectric materials for some of the layers of materials serving as the acoustic mirror and metallic materials for the others of the layers; and b) providing at least one of the metallic layers via a fabrication procedure in which the metallic layer is patterned into distinct portions by an etching process that removes enough of the metallic layer between where different resonator sections are to be placed as to provide electrical isolation between the portions of the layer beneath the different resonator sections;

wherein step (b) comprises the steps of:

i) depositing consecutively the different layers of the acoustic mirror, beginning with a metallic layer and continuing up to but not necessarily including the layer that is to be nearest the resonator, so that the dielectric layers alternate with the metallic layers;

ii) etching through each of the at least one metallic layer, so as to leave on the substrate a pillbox-type structure of the at least one metallic layer, thereby providing at least one patterned metallic layer; and iii) depositing as a filler a dielectric material to replace the material removed by etching, the depositing being sufficient in depth to allow polishing the filler down to the top of the last deposited at least one patterned metallic layer;

thereby providing a multi-resonator BAW filter with reduced capacitive coupling between resonators, compared to the capacitive coupling present in a multi-resonator BAW filter fashioned in a similar manner except excluding the step of etching to pattern at least one metallic layer of the similarly fashioned acoustic mirror.

2. A method as in claim 1, wherein all of the metallic layers of the acoustic mirror are patterned into distinct portions by an etching process that removes enough of the metallic layers between where different resonator sections are to be placed as to provide electrical isolation between all of the portions of the layers beneath the different resonator sections.

3. A multi-resonator bulk acoustic wave (BAW) filter made according to the method of claim 2.

4. A method as in claim 1, wherein:

in step (b) (i), all of the different layers of the acoustic mirror are consecutively deposited, including the layer that is to be nearest the resonator;

in step (b) (ii), all of the layers of the acoustic mirror are etched through, down to the substrate surface, so as to leave on the substrate a pillbox-type structure of the different layers of the acoustic mirror, thereby providing patterned metallic layers and dielectric layers; and in step (b) (iii), the filler is deposited on the substrate to replace the material removed from each of the acoustic mirror layers, the depositing being sufficient in depth to allow polishing the filler down to the top layer of the acoustic mirror.

5. A multi-resonator bulk acoustic wave (BAW) filter made according to the method of claim 4.

6. A method as in claim 1, wherein at least one of the resonator sections is a stacked crystal structure including a top electrode, a middle electrode that is sometimes grounded, and a bottom electrode, and also including two piezolayers sandwiched between the three electrodes.

7. A multi-resonator bulk acoustic wave (BAW) filter made according to the method of claim 1.

8. A method as in claim 1, wherein step (b) comprises the step of depositing consecutively the different layers of the acoustic mirror, with the dielectric layers alternating with the metallic layers and with the layer nearest the resonator being a dielectric, wherein each metallic layer is patterned as in step (b) before depositing the next dielectric layer.

9. A method as in claim 1, wherein step (b) further comprises the step of: depositing the top layer of the acoustic mirror so as to cover not only the already deposited, patterned layers of the acoustic material, but also the filler.

10. A multi-resonator bulk acoustic wave (BAW) filter made according to the method of claim 5.

* * * * *